United States Patent
Lu et al.

(10) Patent No.: US 9,122,166 B2
(45) Date of Patent: Sep. 1, 2015

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 13/946,533

(22) Filed: Jul. 19, 2013

(65) Prior Publication Data

US 2014/0272679 A1   Sep. 18, 2014

Related U.S. Application Data

(60) Provisional application No. 61/779,558, filed on Mar. 13, 2013.

(51) Int. Cl.
*G03F 1/22* (2012.01)
*G03F 1/24* (2012.01)

(52) U.S. Cl.
CPC ......................................... *G03F 1/22* (2013.01)

(58) Field of Classification Search
CPC ..................................... G03F 1/22; G03F 1/24
USPC .............................................................. 430/5
See application file for complete search history.

(56) References Cited

U.S. PATENT DOCUMENTS

2009/0305147 A1\* 12/2009 Constancias ...................... 430/5

\* cited by examiner

*Primary Examiner* — Stephen Rosasco
(74) *Attorney, Agent, or Firm* — Haynes and Boone, LLP

(57) ABSTRACT

An extreme ultraviolet lithography (EUVL) process is disclosed. The process comprises receiving a mask. The mask includes a low thermal expansion material (LTEM) substrate, a reflective multilayer (ML) over one surface of the LTEM substrate, a first region having a phase-shifting layer over the reflective ML, and a second region having no phase-shifting layer over the reflective ML. The EUVL process also comprises exposing the mask by a nearly on-axis illumination with partial coherence less than 0.3 to produce diffracted light and non-diffracted light, removing at least a portion of the non-diffracted light, and collecting and directing the diffracted light and the not removed non-diffracted light by a projection optics box (POB) to expose a target.

20 Claims, 4 Drawing Sheets

EXTREME ULTRAVIOLET LITHOGRAPHY PROCESS AND MASK

This application claims priority to U.S. Provisional Patent Application Ser. No. 61/779,558, filed on Mar. 13, 2013, the entire disclosure of which is hereby incorporated herein by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

EUVL is a promising patterning technology for very small semiconductor technology nodes, such as the 14-nm technology node, and beyond. EUVL is very similar to optical lithography in that it needs a mask to print wafers, except that it employs light in the EUV region, i.e., at about 13.5 nm. At the wavelength of 13.5 nm, most materials are highly absorbing. Thus, reflective optics, rather than refractive optics, are used in EUVL. Although existing methods of EUVL have been generally adequate for their intended purposes, they have not been entirely satisfactory in all respects. For example, challenges rise to improve the EUVL throughput, especially for low pattern density layers, such as a via layer, due to a relatively low transmittance through the vias. It is desired to have improvements in this area

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
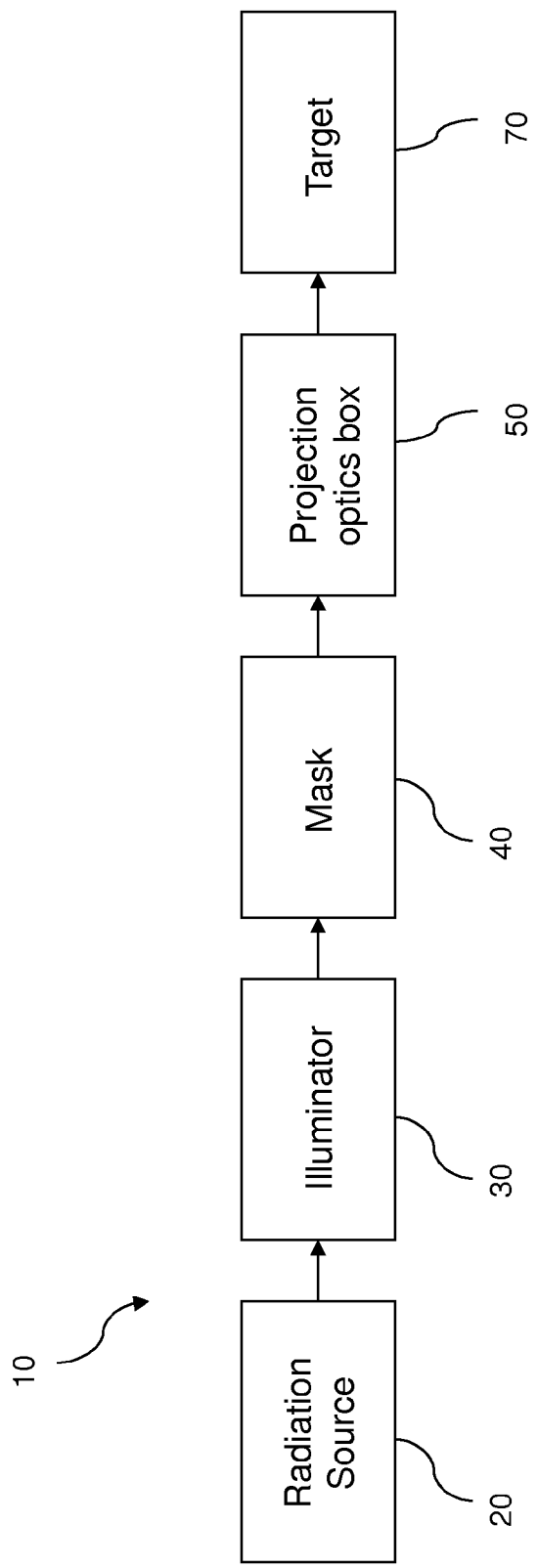
FIG. 1 is a block diagram of a lithography process for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUVL process 10 that may benefit from one or more embodiments of the present invention is disclosed. The EUVL process 10 employs an EUV source 20 that emits radiation having a wavelength λ of about 1-100 nm, including an EUV wavelength of about 13.5 nm.

The EUVL process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask 40. In the EUV wavelength range, reflective optics is employed generally. Refractive optics, however, can also be realized by zone-plates. In the present embodiment, the illuminator 30 is set up to provide a nearly on-axis illumination to illuminate the mask 40. In nearly on-axis illumination, all incoming light rays incident on the mask are at the same angle of incidence (AOI), e.g., AOI=6°, as that of a chief ray. In many situations, there may be some angular spread of the incident light. For example, the EUVL process 10 may utilize disk illumination (i.e., the shape of the illumination on the pupil plane is like a disk centered at the pupil center). When illumination of a partial coherence σ, e.g., σ=0.3, is employed, the maximum angular deviation from the chief ray is $\sin^{-1}$ [m×σ×NA], where m and NA are the magnification and numerical aperture, respectively, of the projection optics box (POB) 50 to be detailed below. Partial coherence σ can also be used to describe a point source which produces a plane wave for illuminating the mask 40. In this case, the distance from the pupil center to the point source in the pupil plane is NA×σ and the AOI of the corresponding plane wave incident on the mask 40 is $\sin^{-1}$ [m×σ×NA]. In the present embodiment, it is sufficient to employ a nearly on-axis illumination consisting of point sources with σ less than 0.3.

The EUVL process 10 also employs a mask 40 (in the present disclosure, the terms mask, photomask, and reticle are used to refer to the same item). The mask 40 can be a transmissive mask or a reflective mask. In the present embodiment, the mask 40 is a reflective mask such as described in further detail below. The mask 40 may incorporate other resolution enhancement techniques such as phase-shifting mask (PSM) and/or optical proximity correction (OPC).

The EUVL process 10 also employs a projection optics box (POB) 50. The POB 50 may have refractive optics or reflective optics. The radiation reflected from the mask 40 (e.g., a patterned radiation) is collected by the POB 50. The POB 50 also includes a pupil filter placed at an optics pupil plane to modulate phase and amplitude of radiation reflected from the mask 40.

Figure 2:
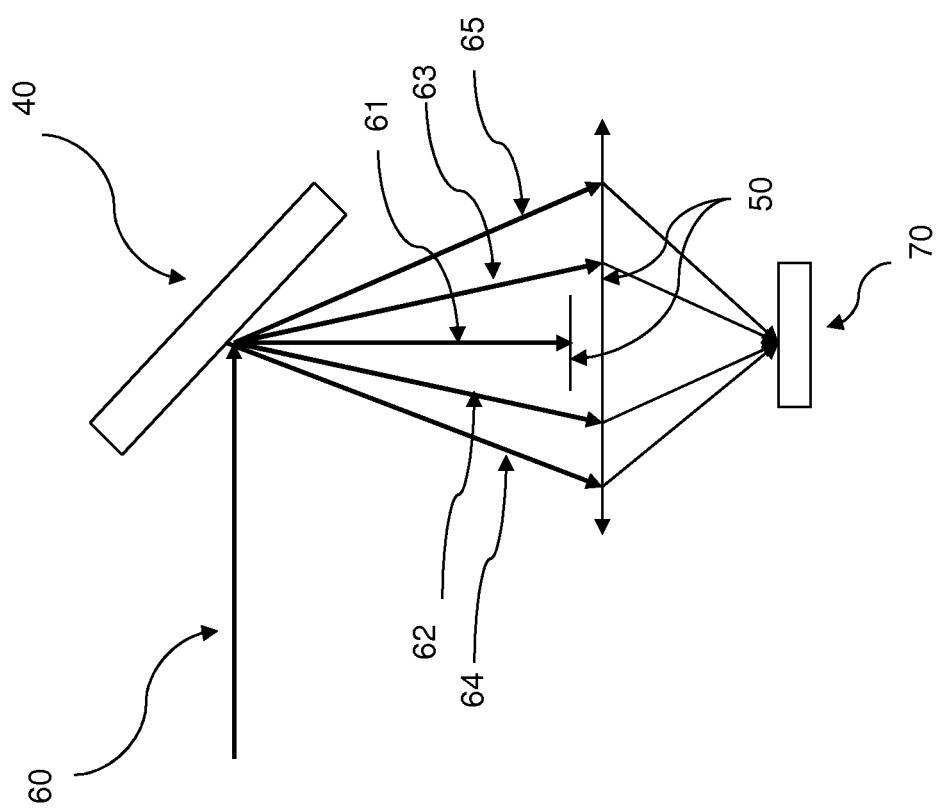
FIG. 2 is a diagrammatic perspective view of a projection optics box (POB) employed in the lithography process for implementing one or more embodiments of the present invention. Since a POB by reflective optics is difficult to sketch, the equivalent refractive optics is used to illustrate the underlying principle.

Referring to FIG. 2, an incident light ray 60, after being reflected from the mask 40, is diffracted into various diffraction orders due to the presence of mask patterns, such as a 0-th diffraction order ray 61, a −1-st diffraction order ray 62 and a +1-st diffraction order ray 63 and other higher diffraction order rays (represented by 64 and 65). For lithographic imaging, purely coherent illumination is generally not employed. Disk illumination with partial coherence σ being at most 0.3 generated by the illuminator 30 is employed. In the depicted embodiment, the non-diffracted light rays 61 are mostly (e.g., more than 70%) removed by the pupil filter in the POB 50. The −1-st and +1-st diffraction order rays, 62 and 63, and other higher diffraction order rays (64 and 65) are collected by the POB 50 and directed to expose a target 70. Removing the non-diffracted light amounts to subtracting the average electric field from the total electric field on the target 70. For a mask with a layout of low pattern density, the average electric field is close to the reflection coefficient of the field of the mask, i.e., the region without polygons. Therefore, for a mask with a layout of low pattern density, removing the non-diffracted light greatly enhances the image log slope of the aerial image formed on the target 70, since the phase difference of electric fields on pattern regions and on the field region is close to 180 degrees.

The target 70 includes a semiconductor wafer with a photosensitive layer (e.g., photoresist or resist), which is sensitive to the EUV radiation. The target 70 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a mask blank fabrication process and a mask patterning process. During the mask blank fabrication process, a mask blank is formed by depositing suitable layers on a suitable substrate. The mask blank is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Figure 3:
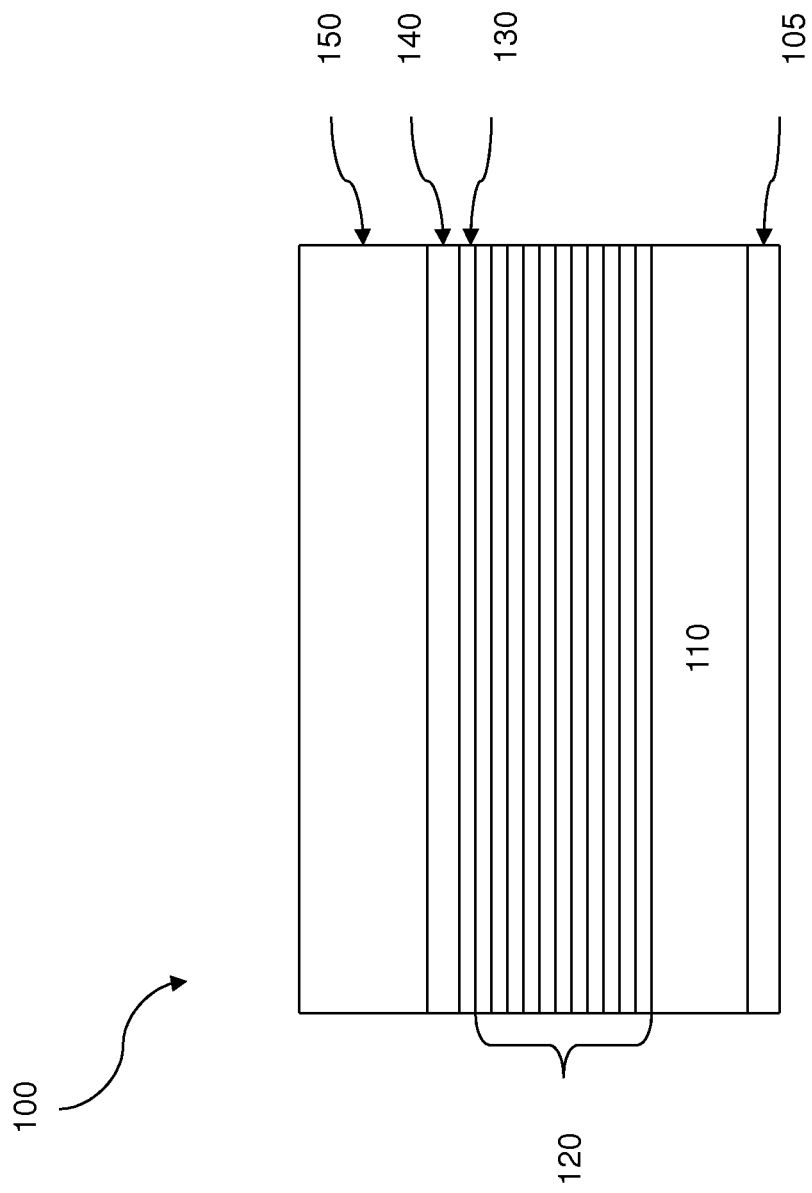
FIG. 3 is a diagrammatic cross-sectional view of various aspects of one embodiment of a mask blank at various stages of a lithography process constructed according to aspects of the present disclosure.

Referring to FIG. 3, a mask blank 100 comprises a substrate 110 made of low thermal expansion material (LTEM). The LTEM material may include $TiO_2$ doped $SiO_2$, and/or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be deposed under (as shown in the figure) the LTEM substrate 110 for the electrostatic chucking purpose. In an embodiment, the conductive layer 105 includes chromium nitride (CrN), though other compositions are possible.

The mask blank 100 includes a reflective multilayer (ML) 120 deposited over the LTEM substrate 110. According to Fresnel equations, an incident light ray will be partially reflected when it propagates across the interface between two materials of different refractive indices. The reflected light ray is larger when the difference of the refractive indices is larger. To increase the reflected light ray, one may also increase the number of interfaces by depositing a ML of alternating materials, and then choose an appropriate thickness for each layer of the ML according to the wavelength and the angle of incidence of the incident light ray so that reflected light rays from different interfaces interfere constructively. However, the absorption of the employed materials for the ML limits the highest reflectivity that can be achieved. In one embodiment, the reflective ML 120 includes molybdenum-silicon (Mo/Si) film pairs (i.e., a layer of molybdenum over a layer of silicon in each film pair). In another embodiment, the reflective ML 120 includes molybdenum-beryllium (Mo/Be) film pairs. In still another embodiment, the reflective ML 120 includes forty Mo/Si film pairs with each Mo/Si film pair consisting of 3-nm Mo and 4-nm Si. In this case, a reflectivity of about 70% is achieved.

The mask blank 100 may also include a capping layer 130 over the reflective ML 120 to prevent oxidation of the reflective ML 120. In one embodiment, the capping layer 130 includes silicon with about 4-7 nm thickness.

The mask blank 100 may also include a buffer layer 140 over the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. A low temperature deposition process is often chosen for the buffer layer to prevent inter-diffusion of the reflective ML 120. In the present embodiment, the buffer layer 140 includes ruthenium with a thickness from 2 nm to 5 nm. In one embodiment, the capping layer and the buffer layer are a single layer.

In the present embodiment, the mask blank 100 includes a phase-shifting layer 150 over the buffer layer 140. The phase-shifting layer 150 includes material or materials whose thickness or thicknesses is or are properly chosen to achieve an about 180-degree phase shift for a light ray reflected from this region (relative to the region without the phase-shifting layer). In one embodiment, the phase-shifting layer 150 includes molybdenum (Mo) having a thickness from 40 nm to 48 nm. The phase-shifting layer 150 may also be formed by multiple layers of different materials.

One or more of the layers 105, 120, 130, 140 and 150 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 4:
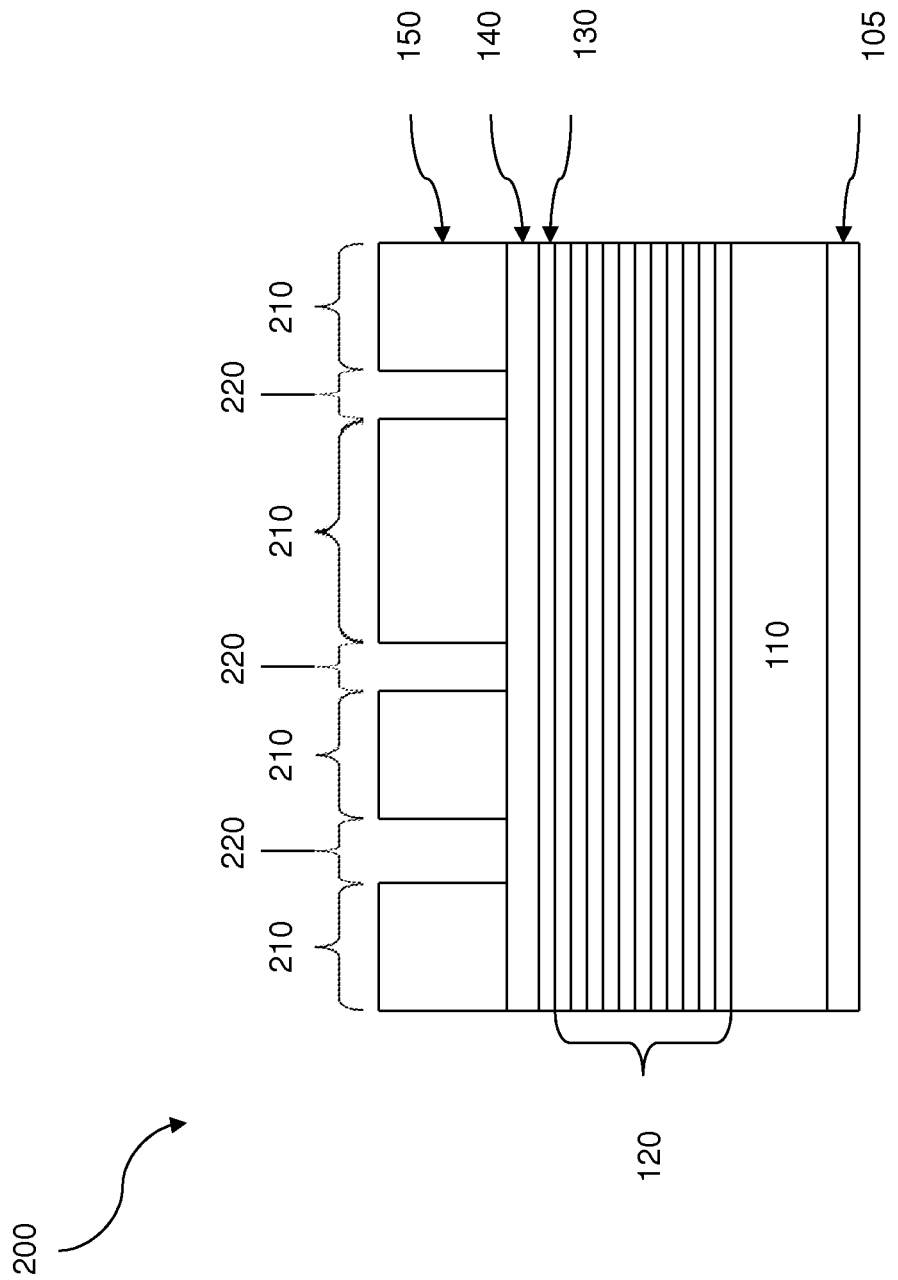
FIG. 4 is a diagrammatic cross-sectional view of various aspects of one embodiment of a mask at various stages of a lithography process constructed according to aspects of the present disclosure.

Referring to FIG. 4, the phase-shifting layer 150 is patterned to form the design layout pattern EUV mask 200 having first and second regions, 210 and 220. The phase-shifting layer 150 is patterned by removing material from the second region 220 while the material remains in the first region 210. The patterned phase-shifting layer produces an about 180-degree phase shift (for the reflected light ray from the first region 210 with respect to the reflected light ray from the second region 220). In the depicted embodiment, in the EUV mask 200 consisting of a layout of low pattern density, the distance between two polygons in the layout is not smaller than about λ/NA. As an example, the low pattern density layer mask 220 is a via layer mask and the second region 220 represent via patterns. Actually, according to the explanation stated above with reference to FIG. 2, either the first region 210 or the second region 220 can be used to define via patterns.

The phase-shifting layer 150 can be patterned by various patterning techniques. One such technique includes using a resist coating (e.g., spin-on coating), soft baking, mask aligning, exposure, post-exposure baking, developing the resist, rinsing, and drying (e.g., hard baking). An etching process is followed to remove portions of the phase-shifting layer 150 and form the first region 210. The etching process may include dry (plasma) etching, wet etching, and/or other etching methods. For example, the dry etching process may implement a fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. Alternative patterning processes include maskless photolithography, electron-beam writing, direct-writing, and/or ion-beam writing.

Based on the above, the present disclosure offers the EUVL process 10 employing a nearly on-axis illumination, e.g., a disk illumination with partial coherence σ smaller than 0.3 to expose a mask to produce diffracted light and non-diffracted light. The EUVL process 10 employs a pupil filter to removes more than 70% of the non-diffracted light so as to obtain the benefit of throughput enhancement. The EUVL process 10 also employs a mask with two regions formed by a patterned phase-shifting layer over the ML. The EUVL process 10 demonstrates an enhancement of aerial image contrast and throughput improvement of low pattern density layer.

The present disclosure is directed towards lithography systems and processes. In one embodiment, an extreme ultraviolet lithography (EUVL) process comprises receiving a mask. The mask includes a low thermal expansion material (LTEM) substrate, a reflective multilayer (ML) over one surface of the LTEM substrate, a first region having a phase-shifting layer over the reflective ML, and a second region having no phase-shifting layer over the reflective ML. The EUVL process also comprises exposing the mask by a nearly on-axis illumination with partial coherence σ less than 0.3 to produce diffracted light and non-diffracted light, removing at least a portion of the non-diffracted light, and collecting and directing the diffracted light and the not removed non-diffracted light by a projection optics box (POB) to expose a target.

In another embodiment, an extreme ultraviolet lithography (EUVL) process comprises receiving a mask. The mask has a first region and a second region. The phase difference between the first region and the second region is about 180 degrees and the reflectivity of the first region is more than 20% of the reflectivity of the second region. The EUVL process also comprises exposing the mask by a nearly on-axis illumination with partial coherence σ less than 0.3 to produce diffracted light and non-diffracted light, removing more than 70% of the non-diffracted light, and collecting and directing the diffracted light and the not removed non-diffracted light by a projection optics box (POB) to expose a semiconductor wafer.

The present disclosure is also directed towards masks. In still another embodiment, a mask for extreme ultraviolet lithography (EUVL) comprises a low thermal expansion material (LTEM) substrate, a reflective multilayer (ML) over one surface of the LTEM substrate, a conductive layer above an opposite surface of the LTEM substrate, a patterned phase-shifting layer over the reflective ML to define a first region and a second region. The phase difference between the first region and the second region is about 180 degrees and the reflectivity of the region with the phase-shifting layer is more than 20% of the reflectivity of the region without the phase-shifting layer The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) process, comprising:
   receiving a mask, the mask including:
      a low thermal expansion material (LTEM) substrate;
      a reflective multilayer (ML) over one surface of the LTEM substrate;
      a first region having a phase-shifting layer over the reflective ML; and
      a second region having no phase-shifting layer over the reflective ML;
   exposing the mask by a nearly on-axis illumination with partial coherence σ less than 0.3 to produce diffracted light and non-diffracted light;
   removing at least a portion of the non-diffracted light; and
   collecting and directing the diffracted light and the not removed non-diffracted light by a projection optics box (POB) to expose a target.

2. The process of claim 1, wherein the phase difference between the first region and the second region is about 180 degrees.

3. The process of claim 1, wherein the reflectivity of the first region is more than 20% of the reflectivity of the second region.

4. The process of claim 1, wherein the phase-shifting layer includes molybdenum (Mo) having a thickness in a range from about 40 nm to 48 nm.

5. The process of claim 1, wherein the total area of the first region is more than two times larger than the total area of the second region.

6. The process of claim 1, wherein the total area of the second region is more than two times larger than the total area of the first region.

7. The process of claim 1, wherein the mask further comprises:
   a conductive layer over an opposite surface of the LTEM substrate;
   a capping layer over the reflective ML; and
   a buffer layer over the capping layer.

8. The process of claim 7, wherein the first region configured as (from top to bottom) the phase-shifting layer/the buffer layer/the capping layer/the reflective ML/the LTEM substrate, and the second region is configured as (from top to bottom) the buffer layer/the capping layer/the reflective ML/the LTEM substrate.

9. The process of claim 1, wherein the portion of the non-diffracted light is removed by a pupil filter.

10. The process of claim 1, wherein more than 70% of the non-diffracted light is removed.

11. An extreme ultraviolet lithography (EUVL) process, comprising:
receiving a mask having a first region and a second region, wherein the phase difference between the first region and the second region is about 180 degrees and the reflectivity of the first region is more than 20% of the reflectivity of the second region;
exposing the mask by a nearly on-axis illumination with partial coherence σ less than 0.3 to produce diffracted light and non-diffracted light;
removing more than 70% of the non-diffracted light; and
collecting and directing the diffracted light and the not removed non-diffracted light by a projection optics box (POB) to expose a semiconductor wafer.

12. The process of claim 11, wherein the mask comprises:
a low thermal expansion material (LTEM) substrate;
a reflective multilayer (ML) over one surface of the LTEM substrate;
a conductive layer over an opposite surface of the LTEM substrate;
a capping layer over the reflective ML;
a buffer layer over the capping layer; and
a phase-shifting layer over the buffer layer.

13. The process of claim 12, wherein the phase-shifting layer includes molybdenum (Mo) having a thickness from 40 nm to 48 nm.

14. The process of claim 12, wherein the first region is configured as (from top to bottom) the phase-shifting layer/ the buffer layer/the capping layer/the reflective ML/the LTEM substrate, and the second region is configured as (from top to bottom) the buffer layer/the capping layer/the reflective ML/the LTEM substrate.

15. The process of claim 11, wherein the total area of the first region is more than two times larger than the total area of the second region.

16. The process of claim 11, wherein the total area of the second region is more than two times larger than the total area of the first region.

17. A mask for extreme ultraviolet lithography (EUVL), comprising:
a low thermal expansion material (LTEM) substrate;
a reflective multilayer (ML) over one surface of the LTEM substrate;
a conductive layer over an opposite surface of the LTEM substrate;
a patterned phase-shifting layer over the reflective ML to define a first region and a second region, wherein the phase difference between the first region and the second region is about 180 degrees and the reflectivity of the region with the phase-shifting layer is more than 20% of the reflectivity of the region without the phase-shifting layer.

18. The mask of claim 17, wherein the phase-shifting layer includes molybdenum (Mo) having a thickness from about 40 nm to about 48 nm.

19. The mask of claim 17, wherein the total area of the region with the phase-shifting layer is more than two times larger than the total area of the region without the phase-shifting layer.

20. The mask of claim 17, wherein the total area of the region without the phase-shifting layer is more than two times larger than the total area of the region with the phase-shifting layer.

* * * * *